United States Patent [19]

Millhimes

[11] Patent Number: 5,046,957
[45] Date of Patent: Sep. 10, 1991

[54] SOLDER PLATE ASSEMBLY AND METHOD
[75] Inventor: Wayne L. Millhimes, Hershey, Pa.
[73] Assignee: AMP Incorporated, Harrisburg, Pa.
[21] Appl. No.: 543,244
[22] Filed: Jun. 25, 1990
[51] Int. Cl.$^5$ ............................................. H01R 4/02
[52] U.S. Cl. ...................................... 439/83; 439/876;
228/180.1
[58] Field of Search ...................... 439/78, 79, 83, 876;
29/839, 840; 228/180.1, 245, 246, 248, 255, 56.3

[56] References Cited

U.S. PATENT DOCUMENTS

| | | | |
|---|---|---|---|
| 3,591,922 | 12/1968 | Pardee et al. | 29/626 |
| 3,864,014 | 2/1975 | Lynch . | |
| 3,932,934 | 1/1976 | Lynch et al. | 29/628 |
| 4,206,542 | 6/1980 | Reavill | 29/877 |
| 4,216,350 | 8/1980 | Reid | 174/68.5 |
| 4,641,426 | 2/1987 | Hartman et al. | 29/839 |
| 4,663,815 | 5/1987 | Hartman et al. | 29/839 |
| 4,774,760 | 10/1988 | Seaman et al. | 29/840 |
| 4,842,184 | 6/1989 | Miller, Jr. | 228/180.1 |
| 4,872,846 | 10/1989 | Clark | 439/83 |

OTHER PUBLICATIONS

Ray Doutrich, "DuFlo" Header System, DuPont, pp. 2'4 (Sep. 26, 1986).
"New Duflow Headers", Dupont Connector Systems (1987).
"Vapor-Phase Quickie Headers", Dupont Connector Systems (1986), pp. 2-7.

Primary Examiner—Neil Abrams
Assistant Examiner—Khiem Nguyen

[57] ABSTRACT

A method and structure includes a solder plate assembly (20) includes a high temperature plastic having apertures (22) arranged in a grid to receive contact pins (14) of a connector (12) inserted therethrough with solder rings (28) cast into the said apertures and adapted to be reflowed to join pins to circuit board circuits contained in board apertures (34) therein.

10 Claims, 3 Drawing Sheets

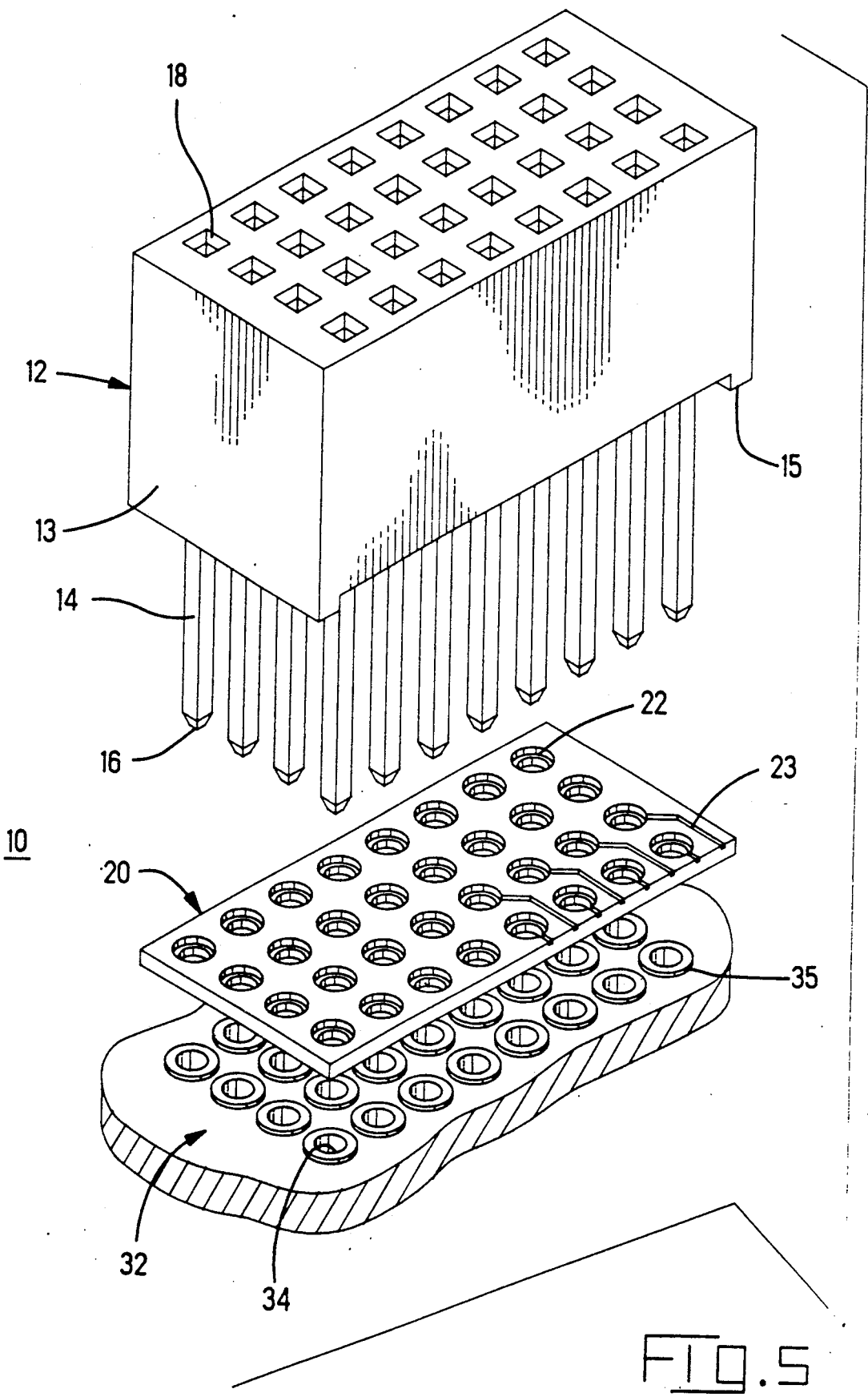

SOLDER PLATE ASSEMBLY AND METHOD

FIELD OF THE INVENTION

This invention relates to a solder plate assembly and method for interconnecting the pins of electrical connectors to circuit paths in or on a circuit board.

BACKGROUND OF THE INVENTION

It is a common practice to solder the pin portions of electrical connectors to circuit paths in or on circuit boards, such connectors frequently including sockets integrally formed with such pins facilitating components or other connectors to be plugged into the circuits formed in or on the circuit boards. Various prior art practices have included the provision of the proper volume of solder in the form of slugs or rings physically attached to a given connector pin in a position so that upon the application of sufficient heat the solder will reflow onto a circuit path or down within an aperture in a circuit board mechanically and electrically joining the pin to the circuit path. Alternatively, solder rings have been placed upon a circuit board with a connector fitted into the apertures of such board through such solder rings and a subsequent reflow to effect an interconnection therebetween. In both instances aforementioned, the preforming of an appropriate solder ring and its physical handling and attachment either to the connector pin or to the board in a one at a time repetitive assembly operation has been employed. With large numbers of pins to be interconnected and with the opportunity for missing one or more pins, or having solder rings accidentally displaced, the foregoing practice risks ruining an entire connector and circuit board or at least requiring a desoldering of the connector and board to repair the mistake.

Accordingly it is an object of the present invention to provide a solder plate assembly and method facilitating multiple interconnection of connector pins to circuit board circuits.

It is a further object to provide an assembly containing arrays of solder rings so affixed thereto so as to preclude accidental displacement or loss and to thereby assure the presence of solder at each desired site relative to connector pin arrays and circuit board circuits.

It is still a further object to provide a method for making solder joints that includes simultaneously casting multiple solder rings into a solder plate assembly so designed to retain such rings in position for assembly to a connector having pins projecting therefrom.

SUMMARY OF THE INVENTION

The present invention achieves the foregoing objectives and overcomes prior art problems through the provision of a solder plate assembly formed of high temperature plastic having apertures therein arranged in a grid complementary to the arrays of pins in an electrical connector. Each aperture contains a solder ring cast therein through the use of a mold closed around such aperture and such plate assembly. The interior surfaces of the aperture are so shaped to retain the solder ring cast therein against accidental displacement. Each solder ring has an interior cross-sectional area larger than the cross-sectional area of the pin to be inserted therethrough to facilitate the mounting of the solder plate assembly upon a connector pin array unit. The assembly of connector, the pins thereof, and the solder plate may then be applied to a circuit board with the pins of the connector inserted into the holes of the board. Sufficient heat to reflow the solder is then applied so that the solder of the rings reflows into the holes and joins the pins to the circuit paths of the circuit board.

IN THE DRAWINGS

FIG. 5 is a perspective, exploded view, showing a connector having an array of pins thereof positioned preparatory to insertion through a solder plate assembly and into a circuit board.

DETAILED DESCRIPTION OF THE INVENTION

Figure 1:
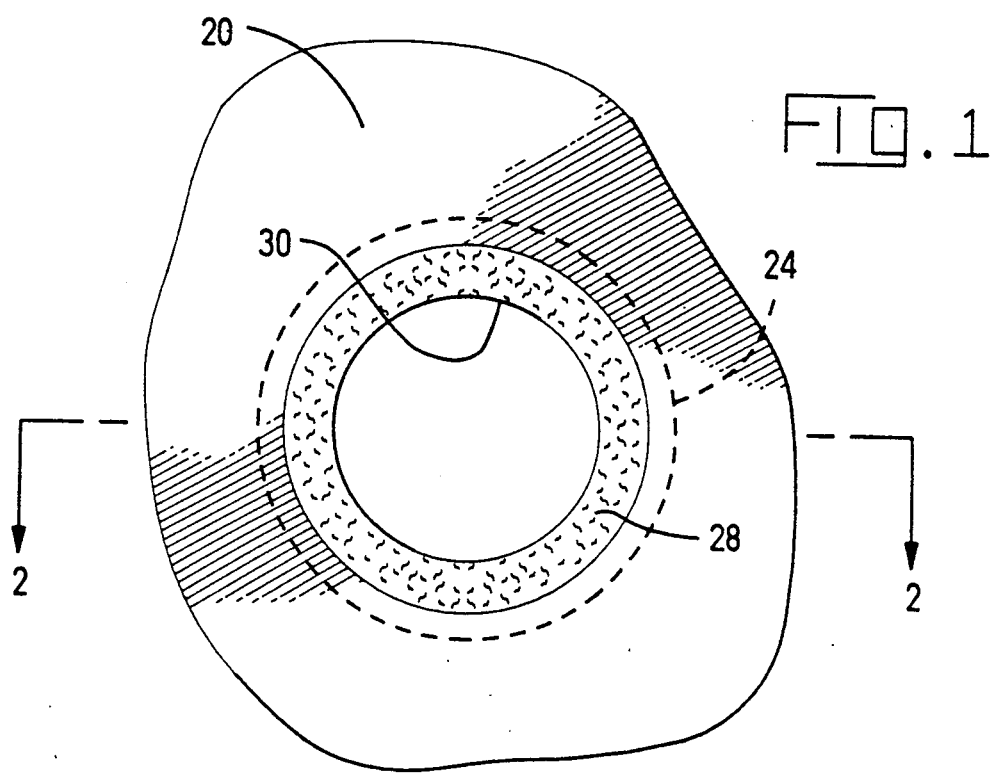
FIG. 1 is a plan view showing a portion of the solder plate containing a solder ring, substantially enlarged from actual size, mounted in such plate.

Referring first to FIG. 5, an assembly 10 is shown including an electrical connector 12, a solder plate assembly 20, and a circuit board 32. The connector 12 includes a plurality of pins 14 which project from the body 13 thereof, in a grid or array. Projections 15 on housing body 13 serve as standoffs. The solder plate assembly 20 includes an array of apertures 22 arranged in like array and a circuit board 32 includes a series of apertures 34 also arrayed in a pattern complementary to that of the connector and the solder plate assembly. Typically pins 14 include a tapered forward section 16, which aids in guiding the pins 14 into corresponding apertures 34 of a circuit board 32. Not shown but included within the housing portion of 12, accessed through apertures such as 18 as shown in FIG. 5 are contact socket portions, which are joined to and typically integral with the post 14. These socket portions are adapted to receive component leads or the leads of mating connectors which in turn are interconnected to circuit paths contained within the circuit board 32 via pins 14, which are soldered to such paths in a manner to be described. The nature and characteristics of the circuit board 32, including apertures 34, embrace a series of circuit paths contained on one or both surfaces of the board 32 or more typically contained in laminations within the board 32 and not shown. The board apertures 34 are plated through holes shown as 35, the plating typically extending over the upper surface of the board as shown in FIGS. 3, 4, and 5.

Figure 2:
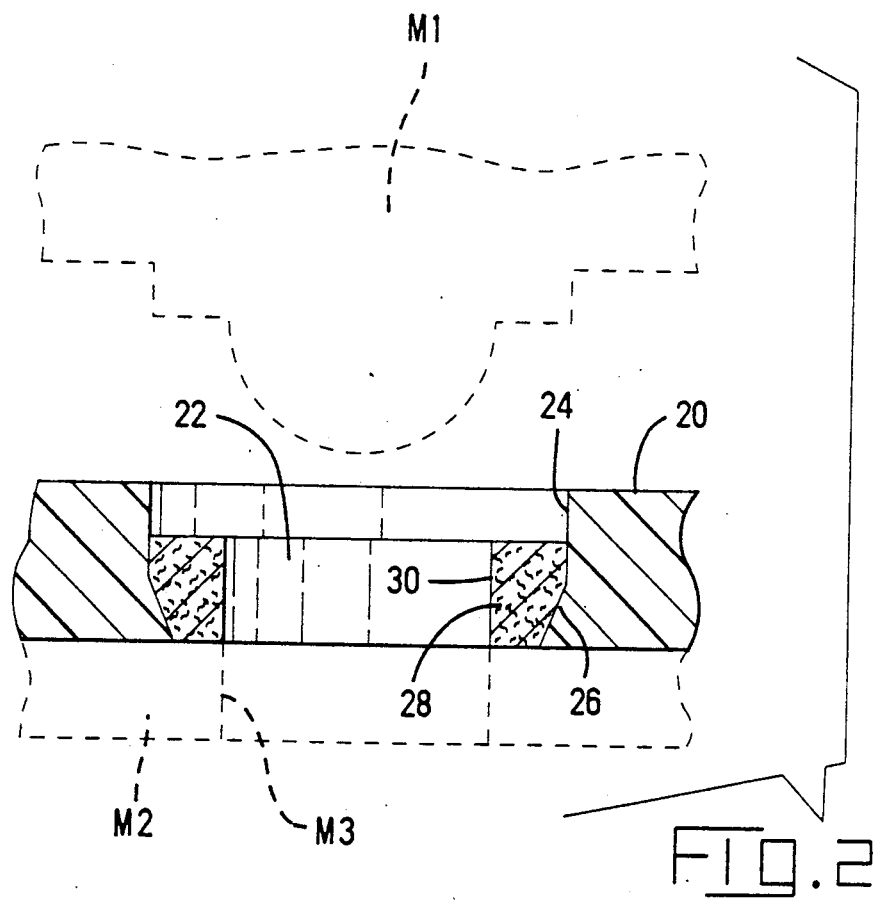
FIG. 2 is a cross-sectional view taken along lines 2—2 of the showing of FIG. 1.
Figure 3:
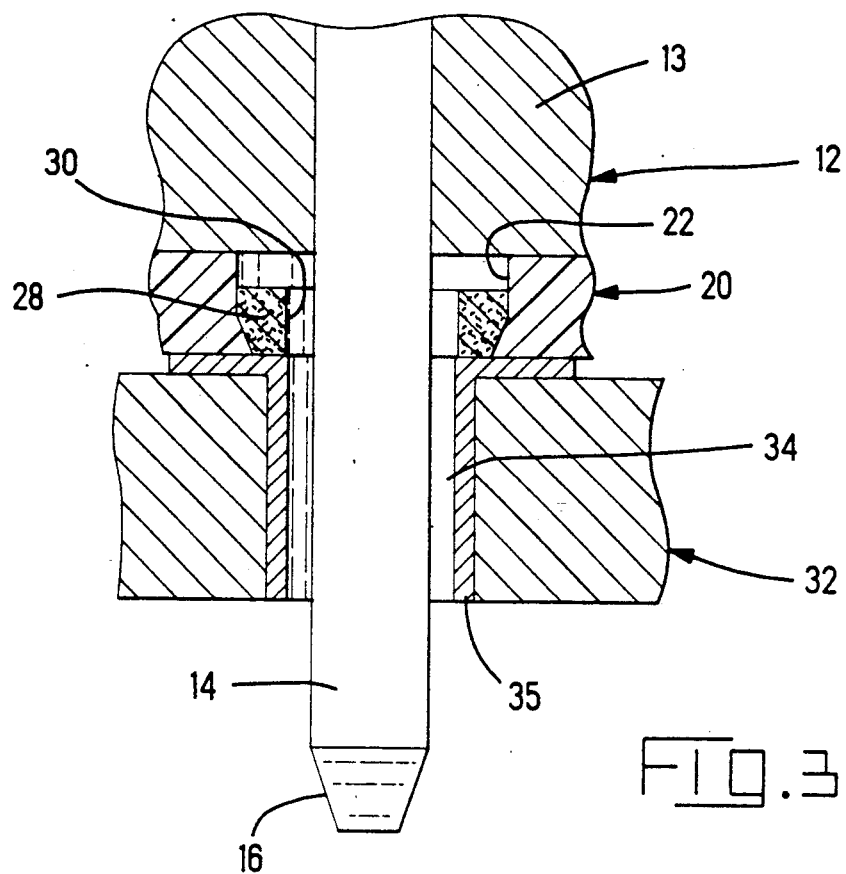
FIG. 3 is an elevational view in partial section showing a connector pin of a connector inserted through the solder plate assembly and the solder ring thereof and into the aperture of a circuit board.
Figure 4:
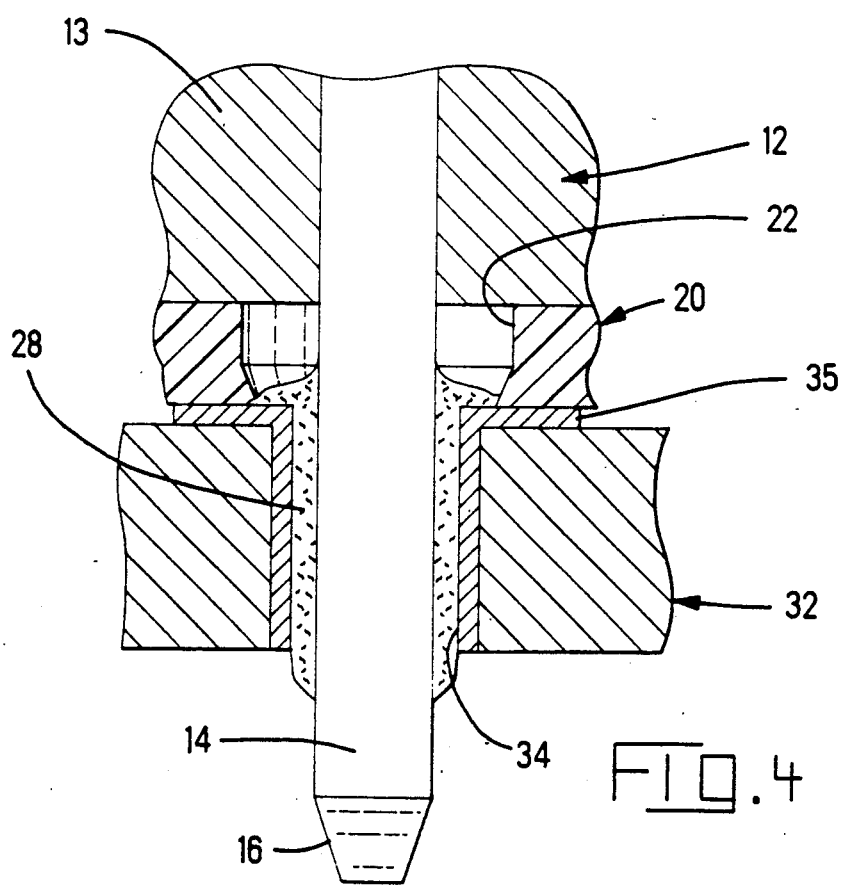
FIG. 4 is a view of the structure of FIG. 3 following solder reflow.

FIGS. 1–3 show in detail a solder ring 28 mounted within an aperture 22 formed in plate assembly 20. The aperture 22 may be seen in FIGS. 1–3 to be defined by an upper interior circular surface 24 and a beveled surface 26. Contained within the aperture 22 is the solder ring 28 which itself includes an interior aperture 30 made larger than the cross-sectional dimensions of pin 14 which is inserted therethrough. In accordance with the method of the invention, the solder ring 28 is cast into the aperture 22 through the use of a mold closed against the exterior surfaces of plate assembly 20. The plate portion of assembly 20 is formed of a plastic material having thermal characteristics so as to withstand the casting process as well as a subsequent reflow of such solder. FIG. 2 shows in phantom the mating portions of a die cast mold including a pin M1, a lower plate M2 apertured at M3 to receive the projecting portions of M1 when fitted therein and clamped upon plate 20. Through sprues or apertures not shown in M1, solder is injected into the void or cavity defined by the interior walls of aperture 24 and beveled portion 26 as well as the surfaces of M1, M2, and M3. Solder is injected into such cavity to form the solder ring 28 and this is achieved simultaneously for each of the apertures in plate 20 in accordance with the invention. FIG. 5 additionally shows drain grooves 23 that may be forming in the plate assembly 20 if desired. Grooves 23 allow for the cleaning of flux or other materials that could be trapped between the under surface of the connector 12 and plate assembly 20 after the soldering operation has been completed. Preferably each aperture 22 would include an associated drain groove 23. The invention thus contemplates the provision of a plastic plate apertured to receive solder rings cast therein into 10 the configuration shown in FIGS. 1-3. The beveled portion 26, in conjunction with the casting process, assures that the rings 28 will remain within plate 20 during and after the casting process. It is contemplated that after fabrication of a connector such as 12, the plate 20 containing rings 28 may be added thereto and pressed home with the pins of the connector fitted through the apertures 30 of the solder rings and the plate made to nest against the lower surface of the connector to form a connector plate assembly. Thereafter and in the final stages of processing, this assembly of connector and plate is plugged into a circuit board, which is subsequently processed through the application of sufficient heat to cause the solder to reflow.

FIG. 3 shows the assembled relationship of a pin 14 extending below body 13 of connector 12 relative to a solder ring 28, solder aperture 30 and inserted into aperture 34 of circuit board 32. As can be discerned, the dimensions of 30 are larger than the width dimensions of the pin to readily facilitate the flow of solder during the application of heat in the manner shown in FIG. 4 to join the pin 14 to the circuit board 32 via solder bonding to the coating 35 therein.

The solder plate assembly 20 should be formed of a high temperature material such as polyphenylene sulfide. The apertures 22 therein in a preferred embodiment relative to the diameter of the circular surface 24, were on the order of 0.080 inches with the diameter of the inner edge of the beveled portion being on the order of 0.070 inches. The solder ring was on the order of 0.020 inches in thickness with the interior diameter of the solder ring being on the order of 0.051 inches. As a practical matter, the plate thickness should be close to the standoff dimension of the connector housing and the solder volume proportional to the diameter of the circuit board aperture and the pin cross-section to effect a fill. The solder utilized in the preferred embodiment was a typical 360° F. melting point tin lead base solder. It is to be understood that the invention is not to be limited to the aforementioned dimensions. As a practical aspect, solder plate assemblies may be made to include a set number of apertures and solder rings such as to form modules used in multiple to accommodate larger pin count connectors, the dimensions of the assemblies adjusted to the pattern of the array of connector pins.

Having now described the invention in terms intended to enable a preferred practice thereof, the definition of the invention is set forth in the appended claims.

I claim:

1. A solder plate assembly for use with connectors having terminal pins projecting therefrom in a given pattern which are required to be soldered to circuits in a circuit board, said assembly comprising:

a thin flat plate of plastic dielectric material having a temperature characteristic so as to maintain mechanical integrity in the presence of molten solder, said plate including a series of apertures formed therein in said given pattern, each said aperture adapted to receive a terminal pin inserted therethrough, each said aperture including an inwardly projecting surface; and a solder ring fitted within the said aperture and engaging said projecting surface, said projecting surface being beveled from a larger diameter upper portion to a smaller diameter lower portion with said projecting surface retaining said solder ring in said aperture, said ring having an interior diameter slightly larger than the exterior diameter of a said terminal pin to facilitate easy insertion therein whereby upon inserting said terminal pins into corresponding apertures of said circuit board and apply sufficient heat to reflow said solder ring, said solder flows down into said circuit board aperture to mechanically and electrically join said terminal pin to said circuit board.

2. The assembly of claim 1 wherein each said ring is formed of material that has been cast into said aperture against the internal surface.

3. The assembly of claim 1 wherein each said ring includes an aperture of a cross-sectional configuration larger than the cross-sectional of a pin and approximate in diameter of the aperture in a circuit board.

4. The assembly of claim 1 wherein said plate further includes drain grooves associated with each of said plate apertures.

5. In combination an electrical connector including an array of terminals having pin portions projecting therefrom, a thin plate of high temperature plastic material containing an array of apertures complementary to the said array of terminals with each aperture larger in diameter than the said pin portions and each plate aperture containing a ring of solder material having an interior cross-sectional area larger than the said pin to facilitate an easy insertion of pins through said apertures in said plate, each aperture including an inwardly projecting surface said projecting surface being beveled from a larger diameter upper portion to a smaller diameter lower portion with said projecting surface retaining said solder ring in said aperture, the said plate being fitted onto the said connector adjacent the bottom surface thereof whereby upon said connector being mounted on a circuit board with the pins thereof fitted into the circuit board holes, the said solder rings are positioned proximate said holes such that upon the application of sufficient heat to reflow said solder, the solder of said rings flows into said holes to join said pins to the circuit therein.

6. The combination of claim 5 wherein the said plate is preferably on the order of between 0.020 and 0.125 inches in thickness.

7. The combination of claim 5 wherein the said solder ring is preferably on the order of 0.015 to 0.060 inches in thickness.

8. The combination of claim 5 wherein the said plate is formed of a plastic material capable of maintaining its mechanical and dielectric properties after exposure to temperatures in excess of 350 degrees Fahrenheit.

9. The combination of claim 5 wherein the said solder rings are intimately bonded to the interior surfaces of the said apertures in said plate.

10. The assembly of claim 5 wherein said plate further includes drain grooves associated with each of said plater apertures.

* * * * *

UNITED STATES PATENT AND TRADEMARK OFFICE
CERTIFICATE OF CORRECTION

PATENT NO. : 5,046,957

DATED : September 10, 1991

INVENTOR(S) : Wayne L. Millhimes

It is certified that error appears in the above-identified patent and that said Letters Patent is hereby corrected as shown below:

Claim 10, Column 6, line 5, delete the word "plater" and insert the word --plate--.

Signed and Sealed this

Twenty-second Day of December, 1992

Attest:

DOUGLAS B. COMER

*Attesting Officer*     *Acting Commissioner of Patents and Trademarks*